(12) United States Patent
Johnson et al.

(10) Patent No.: US 7,485,580 B2
(45) Date of Patent: Feb. 3, 2009

(54) METHOD FOR REMOVING ORGANIC ELECTROLUMINESCENT RESIDUES FROM A SUBSTRATE

(75) Inventors: Andrew David Johnson, Doylestown, PA (US); Peter James Maroulis, Alburtis, PA (US); Mark Ian Sistern, Audlem (GB); Martin Jay Plishka, Apachi Junction, AZ (US); Steven Arthur Rogers, Gilbert, AZ (US); John Bartram Dickenson, North Wales, PA (US)

(73) Assignee: Air Products and Chemicals, Inc., Allentown, PA (US)

(*) Notice: Subject to any disclaimer, the term of this patent is extended or adjusted under 35 U.S.C. 154(b) by 0 days.

(21) Appl. No.: 11/518,958

(22) Filed: Sep. 12, 2006

(65) Prior Publication Data

US 2007/0066177 A1 Mar. 22, 2007

Related U.S. Application Data

(60) Provisional application No. 60/718,712, filed on Sep. 20, 2005.

(51) Int. Cl.
*H01L 21/461* (2006.01)
(52) U.S. Cl. .............. 438/710; 438/727; 438/729; 438/730; 216/68; 216/69
(58) Field of Classification Search ............. 438/710, 438/727, 729, 730; 216/68, 69
See application file for complete search history.

(56) References Cited

U.S. PATENT DOCUMENTS

| | | | |
|---|---|---|---|
| 6,803,097 B2 | 10/2004 | Roitman et al. | |
| 6,872,322 B1 | 3/2005 | Chow et al. | |
| 6,911,667 B2 | 6/2005 | Pichler et al. | |
| 6,949,389 B2 | 9/2005 | Pichler et al. | |
| 2004/0129671 A1* | 7/2004 | Ji et al. ..................... | 216/58 |
| 2005/0112881 A1* | 5/2005 | Prakash et al. ........... | 438/689 |
| 2005/0118085 A1 | 6/2005 | Satchell, Jr. | |
| 2005/0242342 A1* | 11/2005 | Suh et al. ................. | 257/40 |

FOREIGN PATENT DOCUMENTS

KR 2002-0070255 A 9/2002

OTHER PUBLICATIONS

Derbyshire, Oleds: Lighting the Path to True Portability, Semiconductor Manufacturing, Oct. 2005, pp. 23-24.

* cited by examiner

*Primary Examiner*—Binh X Tran
(74) *Attorney, Agent, or Firm*—Rosaleen Morris-Oskanian; Joseph D. Rossi

(57) ABSTRACT

A process for removing organic electroluminescent residues from a substrate is described herein. The process includes the steps of providing a process gas comprising a fluorine-containing gas, optionally an oxygen-containing gas, and optionally an additive gas; activating the process gas in a remote chamber using at least one energy source to provide reactive species; and contacting the surface of the substrate with the reactive species to volatilize and remove the organic electroluminescent residue from the surface.

22 Claims, 3 Drawing Sheets

METHOD FOR REMOVING ORGANIC ELECTROLUMINESCENT RESIDUES FROM A SUBSTRATE

CROSS-REFERENCE TO RELATED APPLICATIONS

This application claims benefit of serial number 60/718,712 filed on Sep. 20, 2005, which is incorporated herein by reference in its entirety.

BACKGROUND OF THE INVENTION

The invention relates in general terms to improving a process for producing an organic light-emitting diode (OLED). In particular, the invention improves the process by providing a dry etch process to remove organic electroluminescent residue from the surface of a substrate such as, for example, a shadow mask, thereby extending the life of the mask and increasing the efficiency of the process.

Organic light emitting diodes (OLED) such as that depicted in FIG. 1 can be constructed by depositing and treating multiple layers of materials such as organic materials on a substrate. When a current is passed through the multiple layers of organic materials, light is emitted. The color of light is dependent on the type of materials.

In single-color OLED devices or displays, also called monochrome OLEDs, these organic layers are not patterned but are formed as continuous layers.

In multicolor OLED devices or displays or in full-color OLED displays, an organic hole-injecting and hole-transporting layer is formed as a continuous layer over and between the first electrodes. A pattern of one or more laterally adjacent organic light-emitting layers are then formed over the continuous hole-injecting and hole-transporting layer. This pattern, and the organic materials used to form the pattern, is selected to provide multicolor or full-color light-emission from a completed and operative OLED display in response to electrical potential signals applied between the first and second electrodes.

Color pixelation of OLED displays can be achieved through various methods as detailed above. One of the most common current methods of color pixelation integrates the use of one or more of the described vapor sources and a precision shadow mask temporarily fixed in reference to a device substrate. Organic light-emitting material employed to create an OLED emitting layer such as, for example, an aluminum quinoline compound ("Alq"), is typically sublimed from a source (or from multiple sources) and deposited on the OLED substrate through the open areas of the aligned precision shadow mask. This physical vapor deposition (PVD) for OLED production is achieved in vacuum through the use of a heated vapor source containing vaporizable organic OLED material. The organic material in the vapor source is heated to attain sufficient vapor pressure to effect efficient sublimation of the organic material, creating a vaporous organic material plume that travels to and deposits on an OLED substrate. Multiple mask-substrate alignments and vapor depositions can be employed to deposit a pattern of differing light-emitting layers on desired substrate pixel areas or subpixel areas creating, for example, a desired pattern of red, green, and blue pixels or subpixels on an OLED substrate. This method, however, suffers from a significant drawback in that not all of the vaporized material present in the vaporous material plume is deposited onto desired areas of the substrate. Instead, much of the material plume is deposited onto the shadow masks, through which multiple depositions are to be made. The deposited residue is often very difficult to remove, thereby rendering the mask unusable after only a moderate number of depositions. Thus, the manufacture is required to the expend additional resources to acquire more shadow masks, which drives up the cost of the manufacturing operation.

To the extent that such residues can be cleaned by wet etching processes, wet etching chemicals have the potential of exposing the operator to hazardous fluids. Wet etching processes also require the removal and disassembly of the process chamber from the process line and/or the exposure of the chamber and its fixtures to liquid chemical solutions. Such solutions can also damage the shadow mask and significantly limit its useful life. Accordingly, there is a need in the art for a dry etch process that can be used in situ to etch organic electroluminescent residue from a substrate such as, for example, a shadow mask, which avoida the aforementioned problems.

BRIEF SUMMARY OF THE INVENTION

The present invention satisfies this need by providing a process for removing organic electroluminescent residue from at least a portion of a surface of a substrate, the process comprising: providing a process gas comprising a fluorine-containing gas, optionally an oxygen-containing gas, and optionally an additive gas; activating the process gas in a remote chamber using at least one energy source to provide reactive species; and contacting the surface of the substrate with the reactive species to volatilize and remove the organic electroluminescent residue from the surface.

In another aspect, the present invention provides a process for removing organic electroluminescent residues from a surface of a shadow mask, the process comprising: providing the shadow mask wherein the shadow mask comprises a surface that is at least partially coated with an organic electroluminescent residue; providing a process gas comprising a fluorine-containing gas, optionally an oxygen-containing gas, and optionally an additive gas; activating the process gas in a remote chamber using at least one energy source to form reactive species; contacting the residues with the reactive species to form at least one volatile product; and removing the at least one volatile product from the shadow mask.

DETAILED DESCRIPTION OF THE INVENTION

Figure 1:
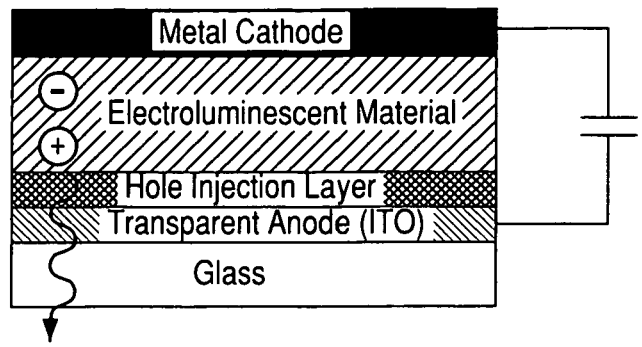
FIG. 1 is a diagram of a prior art, typical organic light emitting diode (OLED).

The present invention provides a process for removing organic electroluminescent residue from at least a portion of a surface of a substrate, the process comprising: providing a process gas comprising a fluorine-containing gas, optionally an oxygen-containing gas, and optionally an additive gas; activating the process gas in a remote chamber using at least one energy source to provide reactive species; and contacting the surface of the substrate with the reactive species to volatilize and remove the organic electroluminescent residue from the surface.

The process of the present invention is useful for removing organic electroluminescent residues from at least a portion of the surface of a substrate such as, for example, a shadow mask. In addition to etching the shadow mask, the process disclosed herein is useful for cleaning organic electroluminescent residues from the inside of process chambers and the surfaces of various fixtures contained therein such as, but not limited to, fluid inlets and outlets, showerheads, work piece platforms, and the like while minimizing damage thereto. Exemplary process chambers include PVD or other evaporation deposition chambers that are used to deposit organic electroluminescent materials on the surface of a substrate. The surface of the chamber and fixtures contained therein may be comprised of a variety of different materials including metals, such as titanium, aluminum, stainless steel, nickel, or alloys comprising same, and/or insulating materials, such as a ceramic, e.g., quartz or $Al_2O_3$.

The material to be removed from the surface being cleaned is converted from a solid non-volatile material into volatile products that are readily removed by a vacuum pump within the process chamber or other means. The term "volatile products", as used herein, relates to reaction products and by-products of the reaction between the organic electroluminescent residues and reactive species formed by activating a process gas comprising a fluorine-containing gas and optionally an oxygen gas and/or additive gas. Unlike mechanical, wet-etching, and/or other cleaning processes, the process disclosed herein does not necessarily require the removal of the process chamber from the process line and/or the exposure of the chamber and its fixtures to liquid chemical solutions.

The method of the present invention includes the step of providing a process gas comprising a fluorine-containing gas, optionally an oxygen-containing gas, and optionally an additive gas. The process gas, once activated as described below, provides the activated species that reacts with and etches the organic electroluminescent residue. Preferred fluorine-containing gases include HF (hydrofluoric acid), $F_2$ (fluorine), $NF_3$ (nitrogen trifluoride), $ClF_3$ (chlorine trifluoride), $SF_6$ (sulfur hexafluoride), FNO (nitrosyl fluoride), $C_3F_3N_3$ (cyanuric fluoride), $C_2F_2O_2$ (oxalyl fluoride), perfluorocarbons such as $CF_4$, $C_2F_6$, $C_3F_8$, $C_4F_8$ etc., hydrofluorocarbons such as $CHF_3$ and $C_3F_7H$ etc., oxyfluorocarbons such as $C_4F_8O$ (perfluorotetrahydrofuran) etc., oxygenated hydrofluorocarbons such as hydrofluoroethers (e.g. methyltrifluoromethyl ether ($CH_3OCF_3$)), hypofluorites such as $CF_3$—OF (fluoroxytrifluoromethane (FTM)) and FO—$CF_2$—OF (bis-difluoroxy-difluoromethane (BDM)), etc., fluoroperoxides such as $CF_3$—O—O—$CF_3$ (bis-trifluoro-methyl-peroxide (BTMP)), F—O—O—F etc., fluorotrioxides such as $CF_3$—O—O—O—$CF_3$ etc., fluoroamines such a $CF_5N$ (perfluoromethylamine), fluoronitriles such as $C_2F_3N$ (perfluoroacetonitrile), $C_3F_6N$ (perfluoroproprionitrile), and $CF_3NO$ (trifluoronitrosylmethane), $COF_2$ (carbonyl fluoride), and mixtures thereof. The amount of fluorine-containing gas present within the process gas can range from about 10% to about 100%, about 10% to about 95%, or about 10% to about 75%, or about 10% to about 50% by volume based upon the total volume of process gas.

In embodiments where carbon is a constituent of the fluorine-containing gas such as, for example, when the fluorine-containing gas is at least one selected from the group consisting of $C_3F_3N_3$, a perfluorocarbon, a hydrofluorocarbon, a hydrofluoroether, a hypofluorite, a fluorotrioxide, a fluoroamine, and a fluoronitrile, it is preferable to also include an oxygen-containing gas within the process gas. The oxygen-containing gas functions to provide a source of oxygen to react with any carbon species that may be form during reaction. Examples of oxygen-containing gases that are suitable for use according to the present invention include, but are not limited to, oxygen ($O_2$), ozone ($O_3$), carbon monoxide (CO), carbon dioxide ($CO_2$), nitrogen dioxide ($NO_2$), nitrous oxide ($N_2O$), nitric oxide (NO), water ($H_2O$), and mixtures thereof. The amount of oxygen-containing gas present in the process gas may range from 0% to 95% based upon the total volume of process gas.

In certain embodiments of the present invention such as, for example, when the process gas comprises at least one gas selected from a hypofluorite, a fluoroperoxide, a fluorotrioxide, and mixtures thereof, the at least one of the oxygen-containing gas and the fluorine-containing gas are the same compound. In such embodiments, these compounds can exhibit a dual function within the process gas mixture and be used, for example, in addition to or in lieu of a separate oxygen-containing gas compound. Examples of suitable fluorine-containing gases that also contain relatively high oxygen content and can be used within these embodiments include fluoroxytrifluoromethane, bis-difluoroxy-difluoromethane, and bis-trifluoro-methyl-peroxide.

The process gas also optionally includes at least one additive gas. In certain embodiments, one or more additive gases may be added to the process gas. The function of the additive gas(es) is to modify the plasma characteristics and cleaning processes to better suit some specific applications. The additive gas(es) may also aid in transporting the oxygen-containing gas and/or fluorine-containing gas to the substrate or process chamber. Examples of additive gases suitable for use according to the present invention include hydrogen, nitrogen, helium, neon, argon, krypton, and xenon. In these embodiments, the amount of additive gas present within the process gas may range from 0% to about 99%, about 25% to about 75%, about 45% to about 55% by volume based upon the total volume of process gas. In preferred embodiments, the amount of additive gas present within the process gas is about 50%.

In certain embodiments of the present invention, the process gas further comprises a chlorine-containing gas. Preferred examples of chlorine-containing gases include $BCl_3$, $COCl_2$, HCl, $Cl_2$, and $NF_xCl_{3-x}$, where x is an integer from 0 to 2, chlorocarbons, and chlorohydrocarbons (such as $C_xH_yCl_z$ where x is a number ranging from 1 to 6, y is a number ranging from 0 to 13, and z is a number ranging from 1 to 14). The amount of chlorine-containing gas present within the process gas can range from 10% to 95%, or 10% to 75%, or 10% to 50% by volume based upon the total volume of process gas.

The fluorine-containing gas, oxygen-containing gas, chlorine-containing gas and the additive gas components of the process gas can be provided, i.e., introduced into, for example, a physical vapor deposition apparatus by a variety of means, such as, but not limited to, conventional cylinders, safe delivery systems, vacuum delivery systems, and/or solid or liquid-based generators that create the fluorine-containing gas at the point of use.

The method of the present invention also includes the step of activating the process gas in a remote chamber using at least one energy source to provide reactive species. The reactive species are typically formed through the activation of the process gas as described above. In preferred embodiments of the invention, a plasma is employed to activate the process gas to provide reactive species to react with and volatize the organic electroluminescent residue from at least a portion of a surface of the substrate. Plasma, however, can heat the substrate during etching and result in a substantial temperature rise. Mask temperature should remain below 100° C. or else the mask may be damaged.

Figure 2:
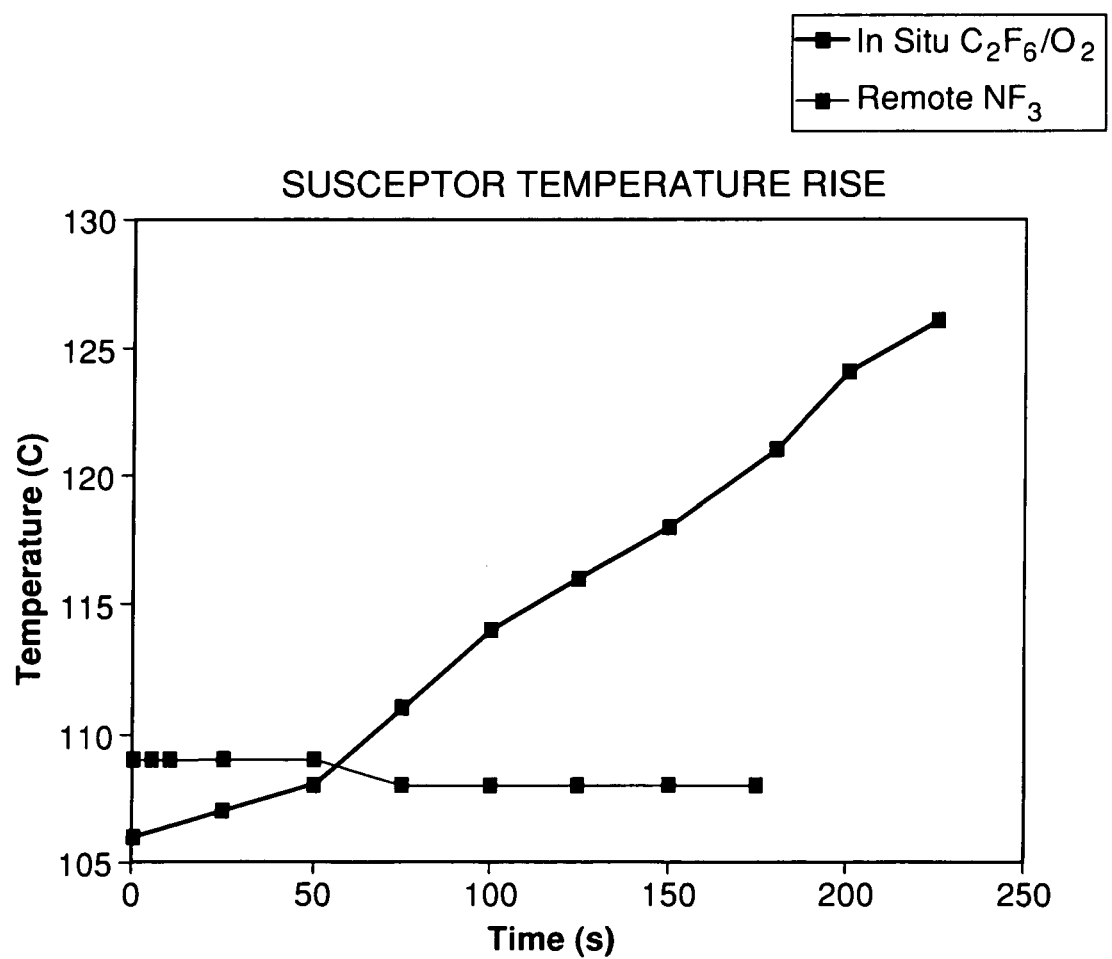
FIG. 2 is a plot of time in seconds versus temperature in degrees Celcius that compares an in situ plasma activated process gas containing $C_2F_6$ and $O_2$ and a remote plasma activated process gas containing $NF_3$.

As an example, FIG. 2 illustrates that the temperature of the susceptor in a CVD chamber was found to rise continuously while sustaining an in situ $C_2F_6/O_2$-based plasma. The temperature rises even though the chamber was operated in plasma etch mode (i.e., the susceptor is grounded resulting in little ion flux). The temperature of the powered electrode (i.e., RIE mode) is expected to be considerably greater due to the presence of a self-bias during etching. An additional consideration is that the mask may be thermally isolated during etching. Thus, the temperature rise is even greater than FIG. 2 indicates since no heat can dissipate from the mask.

Accordingly, in more preferred embodiments of the present invention, remote plasmas are employed to provide the activated species without any temperature rise. In such embodiments, effluent from plasma is generated in a smaller reactor remote to the sputter reactor, which is typically part of the deposition apparatus. A process gas as described above is introduced into the remote chamber where a microwave or RF plasma is sustained. The effluent from this remote chamber, comprising reactive fluorine atoms and inert species, is introduced into the deposition chamber where the reactive fluorine atoms convert the organic electroluminescent residue into volatile compounds that are evacuated from the reactor. After a prescribed time or after the concentration of the formed volatile compounds detected in the effluent is below an acceptable level, the source gas to the remote plasma chamber is stopped. The flow of the deposition gas is then restarted and the CVD deposition process resumed.

Optimum cleaning conditions are process dependent but can include, e.g., using concentration variations of the reactive cleaning gas or using multiple cleaning gases together or stepwise. Moreover, optimum cleaning gas concentrations and reactor residence times can require that a portion of the cleaning gas pass through the system unreacted. While any suitable temperature may be chosen for cleaning, one advantage of the current invention is that the chamber and the mask can be cleaned at temperatures below 150° C. FIG. 2 confirms that during remote plasma etching, no temperature rise is observed.

In addition to the preferred plasma, the process gas may be remotely activated by one or more energy sources such as, but not limited to, thermal/catalytic activation, electron attachment, and photo activation, to form reactive species. These sources may be used alone or in combination such as in tandem.

Thermal or plasma activation and/or enhancement can significantly impact the efficacy of the etching and cleaning of organic electroluminescent residues. In thermal heating activation, the process chamber and fixtures contained therein are heated either by resistive heaters or by intense lamps. The process gas is thermally decomposed into reactive radicals and atoms that subsequently volatize the organic electroluminescent residues. Elevated temperature may also provide the energy source to overcome reaction activation energy barrier and enhance the reaction rates. For thermal activation, the substrate can be heated to at least 100° C. The pressure may range from 10 m Torr to 760 Torr, or from 1 Torr to 760 Torr.

In embodiments wherein an in situ activation, such as in situ RF plasma, is used to activate the process gas, oxygen and fluorine gas molecules contained within the process gas may be broken down by the discharge to form reactive species such as reactive ions and radicals. The fluorine-containing ions and radicals and oxygen-containing ions and radicals can react with the organic electroluminescent residues to form volatile species that can be removed from the process chamber by vacuum pumps.

In embodiments that employ remote thermal activation, the process gas first flows through a heated area outside of the process chamber. The gas dissociates by contact with the high temperatures within a vessel outside of the chamber to be cleaned. Alternative approaches include the use of a remote catalytic converter to dissociate the process gas, or a combination of thermal heating and catalytic cracking to facilitate activation of the oxygen and fluorine-containing gases within the process gas.

In certain embodiments of the present invention, reactions between remote plasma generated reactive species and the organic electroluminescent residues can be activated/enhanced by heating the reactor. The reaction, between the remote plasma generated reactive species and organic electroluminescent residues, can be activated and/or enhanced by heating the reactor to a temperature sufficient to dissociate the oxygen and fluorine containing sources contained within the process gas. The specific temperature required to activate the cleaning reaction with the substance to be removed depends on the process gas recipe.

In one embodiment of the present invention, a combination of a remote plasma and in situ plasma are employed as the energy source to activate the process gas to form the reactive species. In this embodiment, a first portion of the process gas is activated in an area outside of the process chamber, which is introduced into the process chamber after activation. A second portion of the process gas is activated within the process chamber along with any portion of the first activated gas in which the reactive species may have recombined.

In other embodiments of the present invention, the molecules of the components of the process gas can be dissociated by intense exposure to photons to form reactive species. For example, ultraviolet, deep ultraviolet and vacuum ultraviolet radiation can assist breaking strong chemical bonds in organic electroluminescent residues as well as dissociating the oxygen and fluorine-containing gases within the process gas thereby increasing the removal rates of organic electroluminescent residues. Other means of activation and enhancement to the cleaning processes described herein can also be employed. For example, one can use photon induced chemical reactions to generate reactive species and enhance the etching/cleaning reactions.

In yet other embodiments of the present invention, the process chamber can remain at substantially similar operating conditions (pressure and temperature) during the cleaning operation as during the deposition operation. For example, in embodiments wherein the process chamber is used for PVD, the flow of deposition gas is stopped and purged from the reactor and delivery lines. If needed, the temperature of the reactor temperature may be changed to an optimum value; however, in preferred embodiments, the process chamber temperature is maintained at the deposition process conditions.

The method of the present invention also includes the step of contacting the surface of the substrate with the reactive species to volatilize and remove the organic electroluminescent residue from the surface. The process gas is flowed into the process chamber and activated to provide reactive species. The reactive species, in turn, flows into the chamber and contacts the organic electroluminescent residue on the mask and converts the organic electroluminescent residues into a volatile product that is removed from the chamber.

The process will be illustrated in more detail with reference to the following Examples, but it should be understood that the method described herein is not deemed to be limited thereto.

EXAMPLES

The following are experimental examples for removing organic electroluminescent residues from a process chamber using comparative processes and the process described herein. In all of the following experiments, the surface of a silicon wafer was coated with an organic electroluminescent residue generated by depositing aluminum quinoline on silicon wafers. An aluminum tris chinolitato complex was used to deposit the films. The film thickness of each film was measured and found to be approximately 250 nm.

The examples were processed using a process chamber having a remote plasma source (an MKS Astron, available from MKS Instruments of Wilmington, Mass.) attached thereto. The process chamber contained a substrate holder, a gas inlet for the flow of process gases, and an outlet that is connected to a vacuum pump. The walls and internals of the chamber were grounded and maintained at a temperature up to 150° C. After loading samples into the process chamber, the samples were exposed to the remote plasma activated gas.

For the examples using an in situ plasma-cleaning recipe, the chamber was stabilized at a chamber pressure of 1.5 to 3.0 torr and the process gas was introduced into the chamber. The top electrode was then powered by a 13.56 MHz RF power source. The process gas was fed into the chamber through gas inlet, and volatile products of the reaction and the reactive gas were removed from the chamber using the vacuum pump.

Remote plasma cleaning experiments were conducted using a processing chamber having an Astron remote plasma source from MKS Corporation (Wilmington, Mass.). After loading the samples, the reactor was evacuated and a process gas was introduced into the Astron remote plasma generator. The chamber pressure is then stabilized and the remote source is turned on. It is believed that the intense plasma breaks down molecules of the process gas, which flow downstream through a connecting metal tube and into the chamber and react with the organic electroluminescent residues on the chamber surfaces. The volatile compounds formed by the reactions between the reactive species and residues are removed from the reactor through the vacuum port.

A widely used organic electroluminescent material in OLEDs is tris-(8-hydroxyquinoline) aluminum (Alq). We investigated whether $O_2$-based and $NF_3$-based plasmas can etch Alq. The plasma processes that were used are summarized in Table 1. In addition, Table 2 summarizes the range of process conditions that were calculated based upon a plasma kinetic model. In the Table 2, the flow rate of the $NF_3$ is illustrative since the actual flow rate will depend upon the size and geometry of the chamber.

Thin Alq films on a silicon substrate were placed 1 foot from the plasma source (MKS Astron) and exposed to either a remote $O_2$ or remote $NF_3$/Ar plasma (Table 1). The reactor temperature was controlled between 50° C. and 150° C. Etch rates were then determined from a change in film thickness measured by reflectometry.

Figure 3:
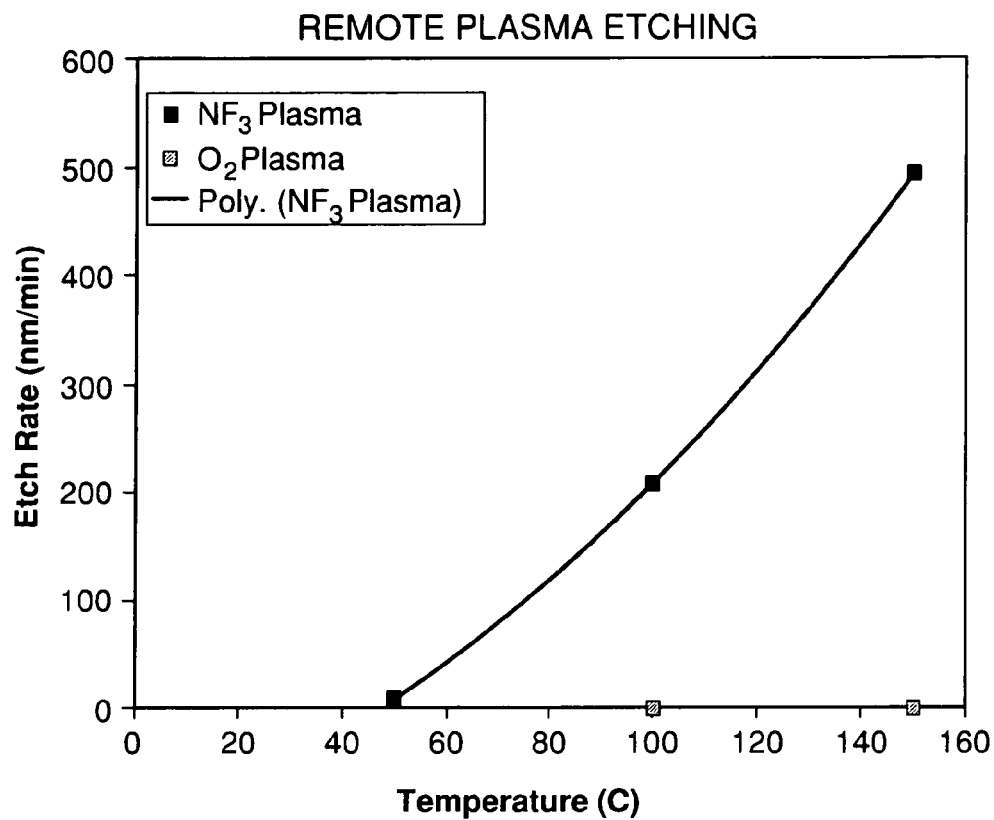
FIG. 3 is a plot of temperature in degrees Celcius versus etch rate in nanometers (nm) per minute (minute) for a remote plasma activated process gas containing $NF_3$ and a remote plasma activated process gas containing $O_2$.

FIG. 3 shows that $O_2$ plasmas are unable to etch the Alq film even at temperatures of 150° C. (FIG. 3). In other words, there was no change in film thickness of the samples after exposure to the $O_2$ plasma.

Figure 4:
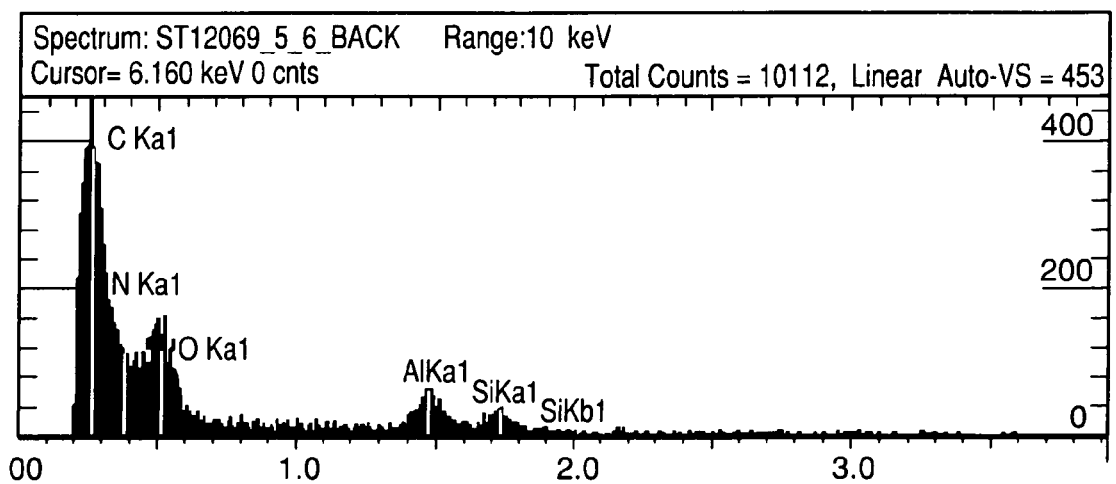
FIG. 4 provides the elemental analysis (EDX) spectrum of an unetched substrate containing organic electroluminescent residues that shows it contains C, N, O, and Al or the aluminum quinoline residues (along with the underlying silicon substrate).
Figure 5:
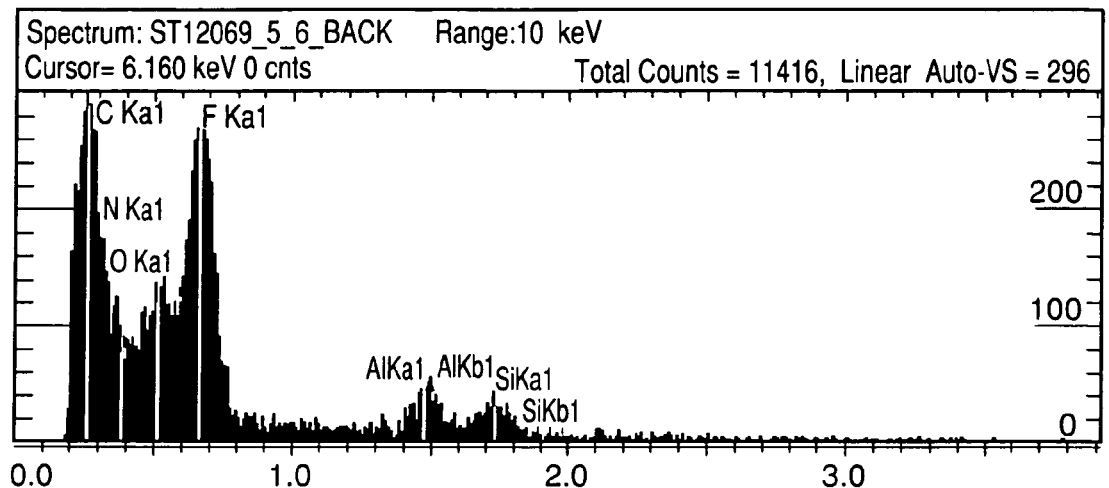
FIG. 5 provides the EDX spectrum of a substrate after etching with a remote plasma activated process gas containing $NF_3$ at 50° C. for 100 seconds that shows it contains C, N, O, Al, and F along with Si. The etch rate was 9 nm/min.

The etch rate using the $NF_3$ plasma was also very low (9 nm/min) at 50° C. after exposure for 100 seconds. It is believed that the Al component of Alq was leaving a residue of non-volatile $AlF_3$ or $Al_2O_3$. Elemental analysis (EDX) of the unetched sample of FIG. 4 confirms its composition: C, N, O, and Al (the underlying Si substrate is also visible in the EDX spectrum). After etching at 50° C., however, fluorine is also observed in the EDX spectrum as shown in FIG. 5. This EDX analysis seems to indicate that a passive $AlF_3$ layer may have been formed that prevented etching by $NF_3$ plasmas.

Figure 6:
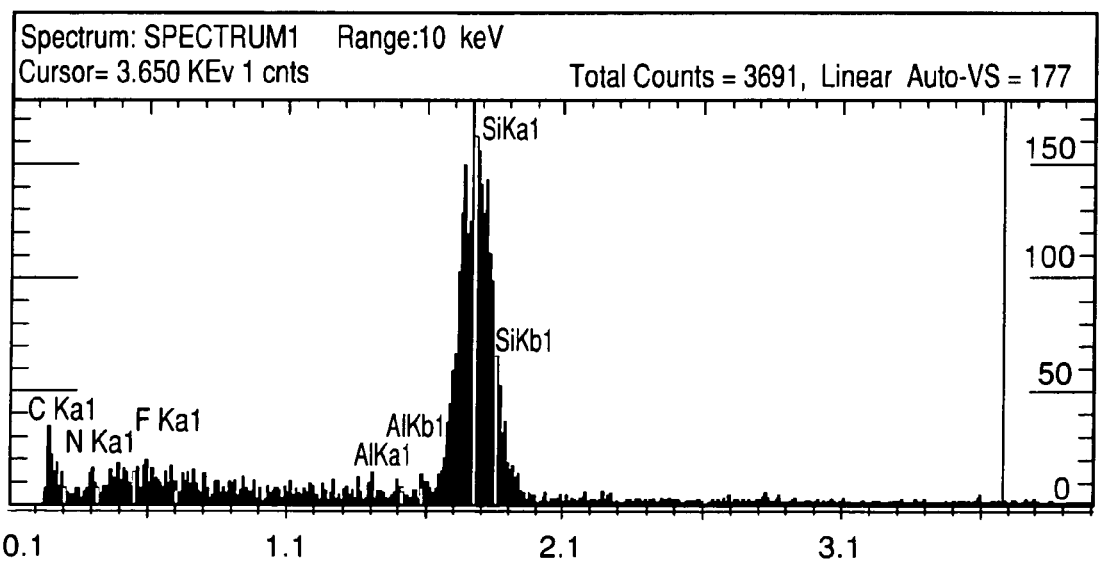
FIG. 6 provides the EDX spectrum of a substrate after etching with a remote plasma activated process gas containing $NF_3$ at 150° C. for 30 seconds that shows that it does not contain C, N, O, and Al—only Si. The etch rate was 494 nm/min.

The etch rate using $NF_3$ plasma seemed to increased by increasing the temperature. The Alq etch rate increased from 9 nm/min to 494 nm/min as the temperature increased from 50° C. to 150° C. (FIG. 3). Etching at 150° C. can also remove all of the Alq material. The EDX spectrum (FIG. 6) of a sample following exposure for 30 seconds at 150° C. shows no Alq features (C, N, O, Al). The only features in the EDX spectrum are assigned to Si from the silicon substrate. It is surprising that the $NF_3$ plasma does not leave any Al residue.

TABLE 1

| Remote activated Plasma Processes | | |
|---|---|---|
| | $NF_3$ Plasma | $O_2$ Plasma |
| $NF_3$ flow rate standard cubic centimeters (sccm) | 2000 | — |
| $O_2$ flow rate (sccm) | — | 2000 |
| Ar flow rate (sccm) | 2000 | 2000 |
| Pressure (torr) | 2 | 2 |

TABLE 2

| Examples of Etch Rates Versus Process Parameters | | | | | | |
|---|---|---|---|---|---|---|
| | Example | | | | | |
| | A | B | C | D | E | F |
| $NF_3$ flow (sccm) | 2000 | 2000 | 2000 | 2000 | 2000 | 2000 |
| Pressure (torr) | 2.0 | 0.5 | 0.05 | 5 | 2 | 2 |
| Ar/$NF_3$ | 1.0 | 1.0 | 1.0 | 1.0 | 2.0 | 0 |
| Relative Etch Rate | 1.00 | 0.25 | 0.01 | 1.60 | 0.83 | 1.30 |

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations are not regarded as a departure from the spirit and scope of the invention, and all such variations are intended to be included within the scope of the following claims.

The invention claimed is:

1. A process for removing organic electroluminescent residue from at least a portion of a surface of a substrate, the process comprising:
   providing a process gas consisting of: a fluorine-containing gas, and an additive gas selected from the group consisting of: $H_2$, $N_2$, He, Ne, Kr, Xe, Ar, and mixtures thereof;
   activating the process gas in a remote chamber using a plasma energy source to provide reactive species, wherein the chamber is operated in a plasma etch mode; and
   contacting the surface of the substrate with the reactive species to volatilize and remove the organic electroluminescent residue from the surface.

2. The process of claim 1 wherein the contacting step is conducted at a temperature of 150° C. or less.

3. The process of claim 1 wherein the contacting step is conducted at a temperature of 100° C. or less.

4. The process of claim 1 wherein the substrate is a shadow mask.

5. The process of claim 1 wherein the fluorine-containing gas comprises at least one selected from the group consisting of: $C_3F_3N_3$, a perfluorocarbon, a hydrofluorocarbon, a hydrofluoroether, a hypofluorite, a fluorotrioxide, a fluoroamine, a fluoronitrile, and mixtures thereof.

6. The process of claim 1 wherein the fluorine-containing gas comprises at least one selected from the group consisting of: $F_2$, HF, $NF_3$, $ClF_3$, $SF_6$, $COF_2$, NOF, $C_2F_2O_2$, an oxyfluorocarbon, a fluoroperoxide, an oxygenated hydrofluorocarbon and mixtures thereof.

7. The process of claim 6 wherein the fluorine-containing gas is $NF_3$.

8. A process for removing organic electroluminescent residues from a surface of a shadow mask, the process comprising:
   providing the shadow mask wherein the shadow mask comprises a surface that is at least partially coated with an organic electroluminescent residue;
   providing a process gas consisting of: a fluorine-containing gas, and an additive gas selected from the group consisting of: $H_2$, $N_2$, He, Ne, Kr, Xe, Ar, and mixtures thereof;
   activating the process gas in a remote chamber using a plasma energy source to provide reactive species, wherein the chamber is operated in a plasma etch mode;
   contacting the residues with the reactive species to form at least one volatile product; and
   removing the at least one volatile product from the shadow mask.

9. The process of claim 8 wherein the contacting step is conducted at a temperature of 150° C. or less.

10. The process of claim 8 wherein the fluorine-containing gas comprises at least one selected from the group consisting of: $F_2$, HF, $NF_3$, $ClF_3$, $SF_6$, $COF_2$, NOF, $C_2F_2O_2$, an oxyfluorocarbon, a fluoroperoxide, an oxygenated hydrofluorocarbon and mixtures thereof.

11. The process of claim 10 wherein the fluorine-containing gas is $NF_3$.

12. A process for removing organic electroluminescent residue from at least a portion of a surface of a substrate, the process comprising:
   providing a process gas consisting of a fluorine-containing gas;
   activating the process gas in a remote chamber using a plasma energy source to provide reactive species, wherein the chamber is operated in a plasma etch mode; and
   contacting the surface of the substrate with the reactive species to volatilize and remove the organic electroluminescent residue from the surface.

13. The process of claim 12 wherein the contacting step is conducted at a temperature of 150° C. or less.

14. The process of claim 12 wherein the contacting step is conducted at a temperature of 100° C. or less.

15. The process of claim 12 wherein the substrate is a shadow mask.

16. The process of claim 12 wherein the fluorine-containing gas comprises at least one selected from the group consisting of: $C_3F_3N_3$, a perfluorocarbon, a hydrofluorocarbon, a hydrofluoroether, a hypofluorite, a fluorotrioxide, a fluoroamine, a fluoronitrile, and mixtures thereof.

17. The process of claim 12 wherein the fluorine-containing gas comprises at least one selected from the group consisting of: $F_2$, HF, $NF_3$, $ClF_3$, $SF_6$, $COF_2$, NOF, $C_2F_2O_2$, an oxyfluorocarbon, a fluoroperoxide, an oxygenated hydrofluorocarbon and mixtures thereof.

18. The process of claim 17 wherein the fluorine-containing gas is $NF_3$.

19. A process for removing organic electroluminescent residues from a surface of a shadow mask, the process comprising:
   providing the shadow mask wherein the shadow mask comprises a surface that is at least partially coated with an organic electroluminescent residue;
   providing a process gas consisting of a fluorine-containing gas;
   activating the process gas in a remote chamber using a plasma energy source to provide reactive species, wherein the chamber is operated in a plasma etch mode;
   contacting the residues with the reactive species to form at least one volatile product; and
   removing the at least one volatile product from the shadow mask.

20. The process of claim 19 wherein the contacting step is conducted at a temperature of 150° C. or less.

21. The process of claim 19 wherein the fluorine-containing gas comprises at least one selected from the group consisting of: $F_2$, HF, $NF_3$, $ClF_3$, $SF_6$, $COF_2$, NOF, $C_2F_2O_2$, an oxyfluorocarbon, a fluoroperoxide, an oxygenated hydrofluorocarbon and mixtures thereof.

22. The process of claim 21 wherein the fluorine-containing gas is $NF_3$.

* * * * *